United States Patent [19]

Yoshida

[11] Patent Number: 5,367,487

[45] Date of Patent: Nov. 22, 1994

[54] SEMICONDUCTOR MEMORY DEVICE

[75] Inventor: Munehiro Yoshida, Yokohama, Japan

[73] Assignee: Kabushiki Kaisha Toshiba, Kawasaki, Japan

[21] Appl. No.: 101,701

[22] Filed: Aug. 4, 1993

[30] Foreign Application Priority Data

Oct. 21, 1992 [JP] Japan .................. 4-283004

[51] Int. Cl.⁵ ............................................. G11C 11/40
[52] U.S. Cl. .................. 365/189.09; 365/226; 365/222
[58] Field of Search .................. 365/189.09, 226, 228, 365/222; 307/296.3, 296.6

[56] References Cited

U.S. PATENT DOCUMENTS

| 4,691,123 | 9/1987 | Hashimoto | 307/296.3 |
| 5,046,052 | 9/1991 | Miyaji et al. | 365/226 |
| 5,222,044 | 6/1993 | Tsujimoto | 365/226 |

Primary Examiner—Joseph A. Popek
Attorney, Agent, or Firm—Banner, Birch, McKie & Beckett

[57] ABSTRACT

An external source voltage is received by a semiconductor memory chip. A first source voltage corresponding to the external source voltage and a second source voltage which is lower than the first source voltage are supplied to an internal circuit of the semiconductor memory chip. The memory chip includes a memory cell array section, having at least a sense amplifier, and a peripheral circuit. The first source voltage is supplied to the memory cell array section when data is transferred between the semiconductor memory chip and an external device, and the second source voltage is supplied thereto to read and write data within the semiconductor memory chip when data is maintained only. The first source voltage is supplied to the peripheral circuit, when the second source voltage is supplied to the memory cell array section to maintain data.

17 Claims, 6 Drawing Sheets

SEMICONDUCTOR MEMORY DEVICE

BACKGROUND OF THE INVENTION

1. Field of the Invention

The present invention relates to a semiconductor memory device wherein a first source voltage corresponding to a power source voltage is supplied to a semiconductor memory chip when data is written or read by an external device, and a second source voltage lower than the first source voltage is supplied to the chip when data is not read or written for a long period of time, i.e., when the chip is in a data maintaining state, in order to reduce overall power consumption.

2. Description of the Related Art

In recent years, there has been growing demand for a semiconductor memory device (hereinafter referred to as a semiconductor memory) which can be driven at higher speed yet consumes less power. A semiconductor memory with lower power consumption is in particularly great demand, since this would reduce the amount of heat generated in a system including a semiconductor memory. A system such as a large-size computer, which includes a number of semiconductor memories, may malfunction due to the amount of heat generated within itself, or a large cooling device must be provided to prevent heat from generating.

Low power consumption is particularly attractive where the semiconductor memory is used in a portable battery-driven personal computer, to increase the lifetime of the battery as long as possible.

To date, various attempts to reduce the power consumption of a semiconductor memory have been made. For example, a static random access memory (SRAM) or pseudo-static random access memory (PSRAM) can lower the source voltage under the control of an external device such as a computer, when data is not accessed, i.e., during a data maintaining period. The lowered source voltage is supplied to an internal circuit of a semiconductor chip to reduce power consumption. This is called a BBU mode (battery back-up mode).

In a dynamic random access memory (DRAM), power consumption is suppressed by increasing the period of time during which memory cells are refreshed.

However, it is difficult for a system including a SRAM or a PSRAM to control the source voltage in accordance with the state of the internal circuit of a semiconductor chip, i.e., depending on whether the internal circuit is in a stand-by state or operating.

Alternatively, the SRAM can decrease the power consumption in response to a chip select signal when the chip is in a stand-by state. However, since, in this case, an operation begins in a state where the source voltage is low, the memory cannot be accessed at high speed.

While the power consumption of a DRAM can be decreased by increasing the refresh time, increasing of the refresh time is limited since pause characteristics must be taken into account.

As described above, in the case where a method for lowering the source voltage in an access stand-by state is employed to decrease power consumption, it is difficult for a control system to control the source voltage outside the semiconductor chip. On the other hand, in order to increase the lifetime of the semiconductor chip, when a method for lowering the source voltage inside the semiconductor chip and supplying it to an internal circuit is employed, the lowered source voltage is generally applied also to peripheral circuits in a stand-by state. Therefore, since an access operation always begins in a state wherein the source voltage is low, the memory cannot be accessed at a high speed. Thus, the conventional semiconductor memory device cannot simultaneously achieve high-speed operation and low power consumption.

SUMMARY OF THE INVENTION

It is accordingly an object of the present invention to provide a semiconductor memory device which has a mechanism for supplying a lower source voltage within an internal circuit in a data maintaining state-wherein data is not read or written for a long period of time-than in an operation state, thereby to achieve lower overall power consumption, while retaining a high-speed access capability.

To achieve the above object, the semiconductor memory device of the present invention comprises:
  source voltage supplying means for receiving, within a semiconductor memory chip, an external source voltage and supplying a first source voltage corresponding to the external source voltage and a second source voltage lower than the first source voltage to an internal circuit;
  a memory cell array section, including at least a sense amplifier, to which the first source voltage is supplied when data is transferred between the semiconductor memory chip and an external device, and the second source voltage is supplied to read and write data within the semiconductor memory chip when data is maintained only; and
  a peripheral circuit to which the first source voltage is supplied while the second source voltage is being supplied to the memory cell array section to maintain data.

With this structure, the semiconductor memory device of the invention has a low power consumption in a data maintaining state while retaining a high-speed access capability in a normal operating state, and is applicable not only to a DRAM but also to a SRAM or a PSRAM. Specifically, in a normal operating state, the memory device keeps the source voltage high, whereas in a data maintaining state, wherein data is not accessed for a long period of time, a lower source voltage is supplied to a memory cell array section. However, a higher source voltage is supplied to peripheral circuits in preparation for accessing. Therefore, even when the state of the device is changed from the data maintaining state to the normal operating state, operations performed by the peripheral circuits are not delayed. In addition, since the peripheral circuits can be set in a stand-by state, they consume substantially less power.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A DRAM according to an embodiment of the present invention will be described with reference to the accompanying drawings.

Figure 1:
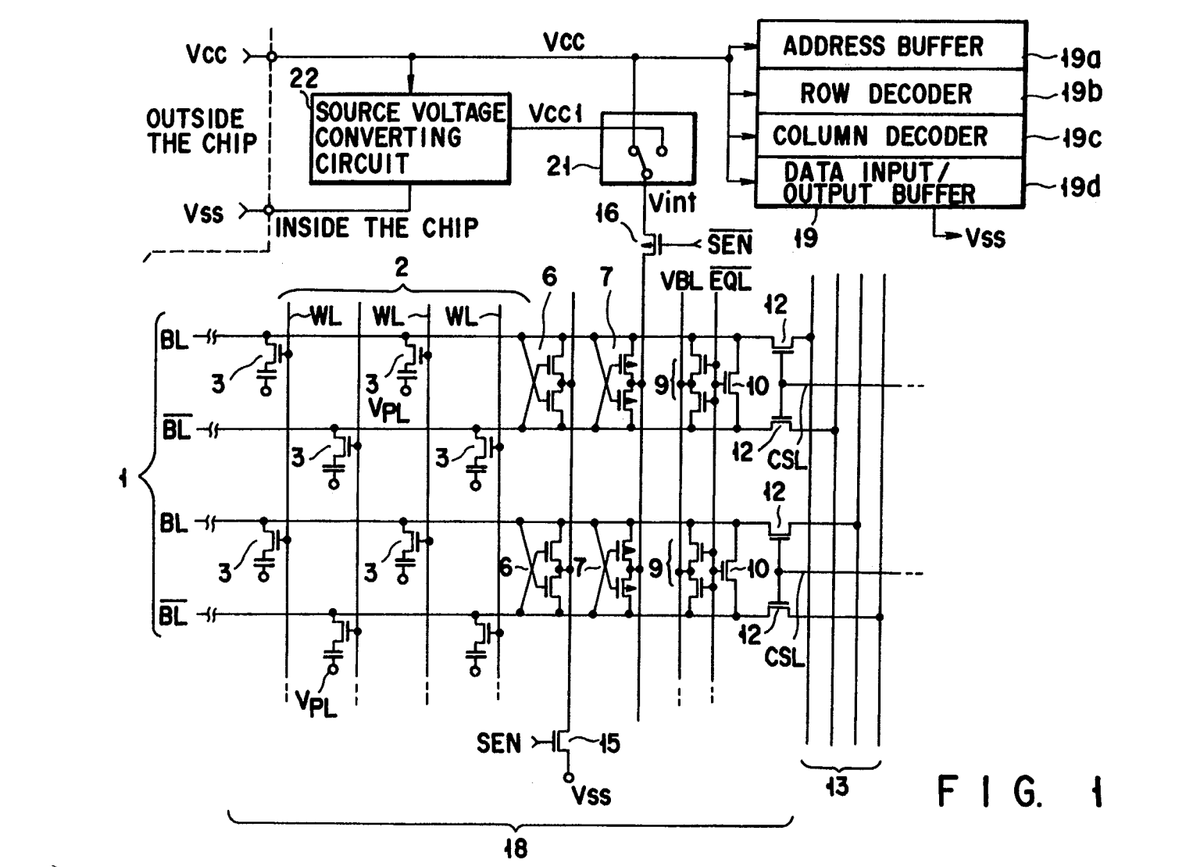
FIG. 1 is a circuit diagram showing a main part of a semiconductor memory chip according to an embodiment of the present invention.

FIG. 1 is a main part of the DRAM according to an embodiment of the present invention. Memory cells 3, 3, . . . , each consisting of a transfer transistor and a capacitor, are provided at predetermined intersections of bit lines 1 and word lines 2. More specifically, terminals of a memory cell are connected to an intersection of an n-th bit line and an n-th word line odd number) and an intersection of an (n+1)th bit line and an (n+1)th word line. An N-type sense amplifier 6, a P-type sense amplifier 7, a precharging transistor 9 for setting a potential across bit lines at a predetermined value, and an equalizing transistor 10 are connected between complementary bit lines 1 (BL and $\overline{BL}$). Transfer transistors 12 are respectively connected to I/O lines 13.

The memory cell array consisting of the memory cells 3 and the sense amplifiers constitute a memory cell array section 18. The memory cell array section 18 is associated with a peripheral circuit including an address buffer 19a, a row decoder 19b, a column decoder 19c, and a data input/output buffer 19d.

A transistor common node of N-type sense amplifiers 6 is connected to a "0" potential $V_{ss}$ through a transfer transistor 15. An internal source potential $V_{int}$ is supplied to a transistor common node of P-type sense amplifiers 7 through a transfer transistor 16.

The internal source potential $V_{int}$ is controlled as follows by a switch circuit 21 for selecting one of an external source voltage $V_{cc}$ and an internal source voltage $V_{cc1}$ lower than the external source voltage $V_{cc}$.

when data is read from or written into a semiconductor chip by an external device, the external source voltage $V_{cc}$ is supplied without change to the memory cell array section 18 and the peripheral circuit 19. When data is maintained for a long period of time, i.e., in a data maintaining state, the lower internal source voltage $V_{cc1}$, instead of the external source voltage $V_{cc}$, is supplied to the memory cell section 18 in response to a command signal.

A source voltage converting circuit 22 lowers the external source voltage $V_{cc}$ and generates an internal source voltage $V_{cc1}$ for a data maintaining operation. One source voltage converting circuit 22 may be provided in the chip or a plurality of source voltage converting circuits 22 may be provided for respective memory cell sub-arrays.

An operation of the above circuit shown in FIG. 1 will now be described. In a normal operating state, the switch circuit 21 is connected to the side of the external source voltage $V_{cc}$ to supply the external source voltage $V_{cc}$ to the memory cell array section 18. When a command signal $V_{ss}$ is input from an external device, the switch circuit 21 is switched so as to select the internal source voltage $V_{cc1}$, which is supplied to the memory cell array section 18.

Figure 2:
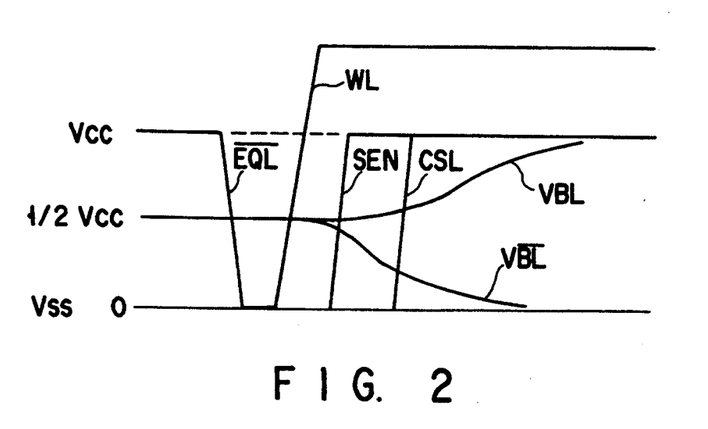
FIG. 2 is a diagram illustrating a normal operation of the circuit shown in FIG. 1.

A normal reading operation will be described with reference to the waveform diagram shown in FIG. 2. The switch circuit 21 is connected to the side of the external source voltage $V_{cc}$. When a memory cell 3 is not selected, an equalize voltage EQL is supplied to bit lines, which are precharged at a potential of $\frac{1}{2} V_{cc}$ by an operation of the transistor 10.

When a line WL of the word lines 2, corresponding to a row address to be selected, is selected, data written ten in a corresponding memory cell 3 is transferred to the bit line 1 connected thereto. The transfer transistor 15 is set in a conductive state, the N-type sense amplifier 6 is operated, and the cell data is latched by the bit line 1. One of the complementary bit lines 1 (BL or $\overline{BL}$) is charged to the potential of $V_{cc}$ by operating the N-type sense amplifier 7. "0" data and "1" data are respectively restored to the command signal $V_{ss}$ and the external source voltage $V_{cc}$ by charging discharging the bit line 1. When a column selection line CSL corresponding to a column address is selected in a state where data is latched, the data is transferred to the I/O line 13 and output through a data output circuit (not shown) to an external device.

Thus, the reading operation is completed. The bit lines are precharged to the potential of $\frac{1}{2} V_{cc}$ again and prepare for next accessing.

An operation which consumes current most of all the operations performed by the memory cell array section 18 is charging or discharging of the bit lines 1. The current is increased in proportion to the level of the source voltage $V_{cc}$, since the total capacitance of the bit lines 1 which are precharged at the potential of $\frac{1}{2} V_{cc}$ is charged or discharged between the potentials of $V_{cc}$ and $V_{ss}$.

Even in a data maintaining state wherein the memory cell is not accessed, since a circuit (not shown) generates a plate potential $V_{PL}$ of the memory cells 3, a plate potential for precharging the bit line potential $V_{BL}$ to $\frac{1}{2} V_{cc}$, and a bit line potential, the circuit consumes currents in addition to the normally-consumed current.

An operation of refreshing cell data is the same as the reading operation except that cell data is not transferred to the I/O line 13, since no column line CSL is selected. However, since the bit lines are charged and discharged, the same current as in the normal reading operation is consumed.

In consideration of the above, the SRAM or PSRAM according to the present invention sets the source voltage applied to the memory cell array to $V_{cc1}$ which is lower than $V_{cc}$, when the memory device is set in the BBU mode. The DRAM according to the present invention decreases the charging and discharging current in the refreshing operation.

Figure 3:
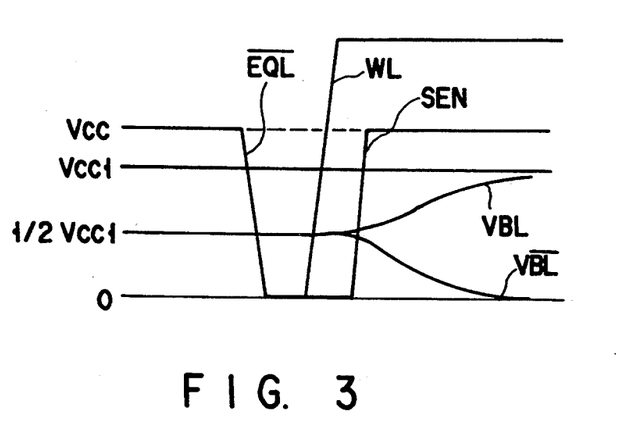
FIG. 3 is a diagram illustrating an operation in an access stand-by state of the circuit shown in FIG. 1.

FIG. 3 is a diagram illustrating an operation in an access stand-by state of the circuit configuration shown in FIG. 1. As apparent from comparison between FIGS. 2 and 3, the current consumed by charging or discharging the complementary bit lines BL and $\overline{BL}$ is less in the case of the source voltage $V_{cc1}$ than in the case of $V_{cc}$. In the access stand-by state, since the plate potential $V_{PL}$ and the bit line potential $V_{BL}$ of the memory cell shown in FIG. 1 are as low as $\frac{1}{2} V_{cc1}$, the circuits for generating these potentials consume less currents.

As shown in FIG. 3, even when the potential $V_{cc1}$ is applied to the memory cell section 18, the potential $V_{cc}$, the same as that of an external power source, is applied to the peripheral circuit 19. Therefore, when the state of the semiconductor memory device is changed from the BBU mode to the normal operating state, an operation performed by the peripheral circuit is not delayed and a time for restoring the potential $V_{cc1}$ to $V_{cc}$ is not required.

Thus, according to the semiconductor memory device of the present invention, since the source voltage of $V_{cc}$ is supplied to the internal circuit in reading and writing operations (normal operating state), high-speed operation can be performed. Further, the source voltage is lowered to the potential of $V_{cc1}$ in an access standby state, thereby achieving lower power consumption.

Figure 4:
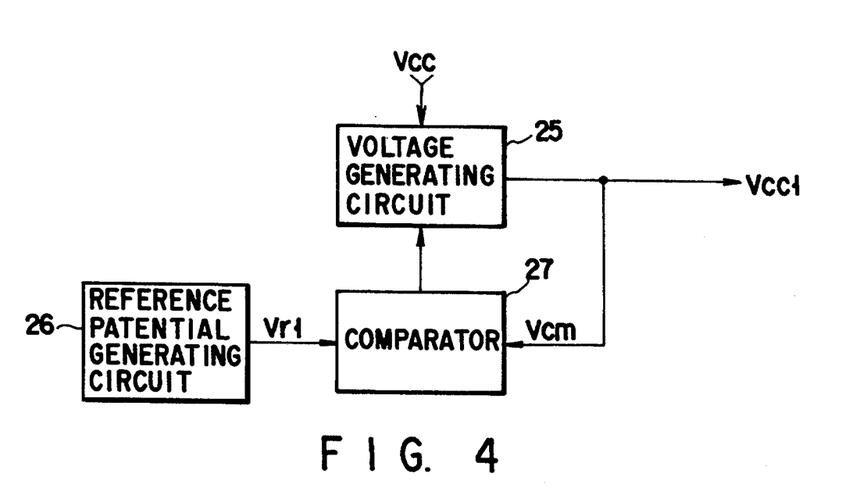
FIG. 4 is a block diagram showing a detailed configuration of the source voltage converting circuit shown in FIG. 1.

FIG. 4 is a circuit diagram showing a detailed configuration of the source voltage converting circuit 22 shown in FIG. 1. A voltage generating circuit 25 receives an external source voltage $V_{cc}$ and generates a source voltage $V_{cc1}$. A comparator 27 compares a potential $V_{cm}$ divided from the source voltage $V_{cc1}$ with a reference potential $V_{r1}$ generated by a reference potential generating circuit 26. The voltage generating circuit 25 is controlled by an output from the comparator 27, thereby generating a desired potential $V_{cc1}$.

Figures 5, 6:
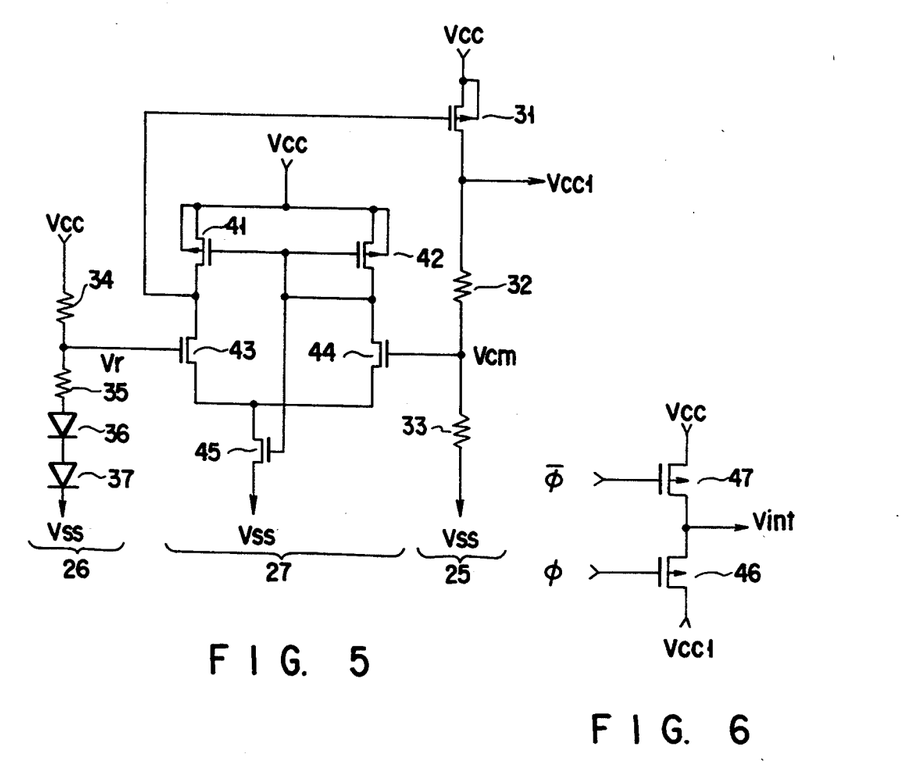
FIG. 5 is a circuit diagram showing the configuration shown in FIG. 4.
FIG. 6 is a circuit diagram showing the selection circuit shown in FIG. 1.

FIG. 5 is a circuit diagram showing the configuration shown in the block diagram of FIG. 4. The voltage generating circuit 25 receives the source voltage $V_{cc}$ and generates, through a P-channel MOSFET 31, a source voltage $V_{cc1}$ divided by resistors 32 and 33 connected in series. The comparator 27 compares the potential $V_{cm}$ divided by the resistors 32 and 33 of the voltage generating circuit 25 with the reference potential $V_r$ divided by resistors 34 and 35, and diodes 36 and 37 in a reference potential generating circuit 26.

The comparator 27 comprises P-channel MOSFETs 41 and 42 serving as load resistors, N-channel MOSFETs 43 and 44, and an N-channel MOSFET 45. The sources of the P-channel MOSFETs 41 and 42 receive the source voltage $V_{cc}$. The drains thereof are connected to the N-channel MOSFETs 4B and 44. The reference potential $V_r$ arid the potential $V_{cm}$ are respectively supplied to the gates of the N-channel MOSFETs 43 and 44. The common gate of the MOSFETs 41 and 42 is connected to the drain of the MOSFET 44 and the gate of the MOSFET 45. The drain of the MOSFET 43 is connected to the gate of the MOSFET 31. To change the potential of $V_{cc1}$, it is only necessary to change the potential level of $V_r$ or $V_{cm}$.

FIG. 6 is a circuit diagram showing the configuration of the switch circuit 21 shown in FIG. 1. P-channel MOSFETs 46 and 47 are connected in series. $V_{cc1}$ and $V_{cc}$ are respectively supplied to respective ends of the MOSFETs. Control signals $\phi$ and $\overline{\phi}$ (an inverted signal of $\phi$) are supplied to the gates of the MOSFET 46 and 47. The control signals $\phi$ and $\overline{\phi}$ switch the states of the semiconductor memory device, i.e., the normal reading or writing operation state and the data maintaining state wherein a lowered source voltage is supplied. By using the control signals, a predetermined internal source potential $V_{int}$ is obtained from a connection node between the MOSFETs 46 and 47.

Figure 7:
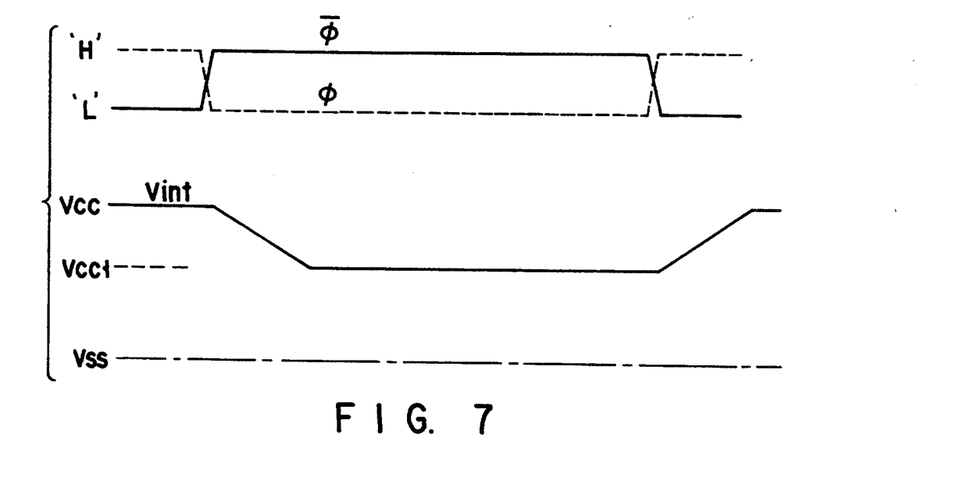
FIG. 7 is a timing chart illustrating an operation of the selection circuit shown in FIG. 6.

FIG. 7 is a timing chart illustrating an operation of the circuit shown in FIG. 6. When the signal $\overline{\phi}$ is of L level, $V_{int}$ is equal to $V_{cc}$. In this state, a normal reading and writing operation can be performed. When the signal $\overline{\phi}$ is of H level, $V_{int}$ is equal to $V_{cc1}$. In this state, data can only be maintained.

The control signals $\phi$ and $\overline{\phi}$ can be generated by a circuit in response to, for example, a clock signal, an address signal, or a data signal, which is input from an external device outside the chip. Alternatively, the control signals can be directly input from an external device through a pin provided for this purpose only. If the source voltage should not be lowered even in the data maintaining state from the view point of the specification, the control signal $\overline{\phi}$ can be maintained at the low level so that $V_{int}$ is kept equal to $V_{cc}$.

Figure 8:
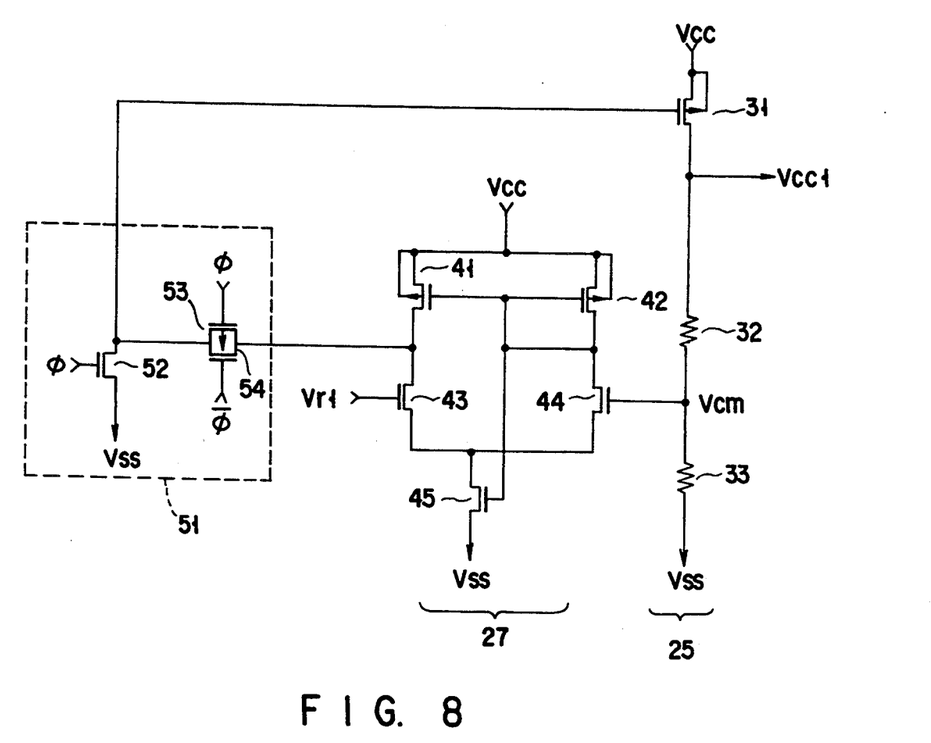
FIG. 8 is a circuit diagram showing a modification of the configuration shown in FIG. 5.

FIG. 8 is a circuit diagram showing a modification of the configuration shown in FIG. 5, wherein the voltage generating circuit 25 has a function of a switch circuit as shown in FIG. 6. A switch circuit 51 is connected between the gate of the N-channel MOSFET 31 and the drain of the N-channel MOSFET 43 shown in the circuit diagram of FIG. 5.

In the switch circuit 51, the drain of an N-channel MOSFET 52 is connected to the gate of the MOSFET 31. The signal $\phi$ is input to the gate of the N-channel MOSFET 52. The drain of the N-channel MOSFET 52 is connected to the drain of the N-channel MOSFET 43 through a P-channel MOSFET 53 and an N-channel MOSFET 54. The source or drain of the MOSFET 53 is connected to the source or drain of the MOSFET 54 in parallel. The control signals $\phi$ and $\overline{\phi}$ are respectively supplied to the MOSFETs 53 and 54.

In this embodiment, a lower source voltage $V_{cc1}$ is supplied in the data maintaining state, thereby reducing the power consumption, while a normal higher source voltage $V_{cc}$ is supplied in the normal operating state. In addition, since, in the data maintaining state, the higher source voltage $V_{cc}$ is supplied to peripheral circuits which do not relate to the data maintaining operation, the peripheral circuits can be operated at high speed when the state of the semiconductor memory device is changed from the data maintaining state to the normal operating state wherein the memory cell array is accessed.

Figure 9:
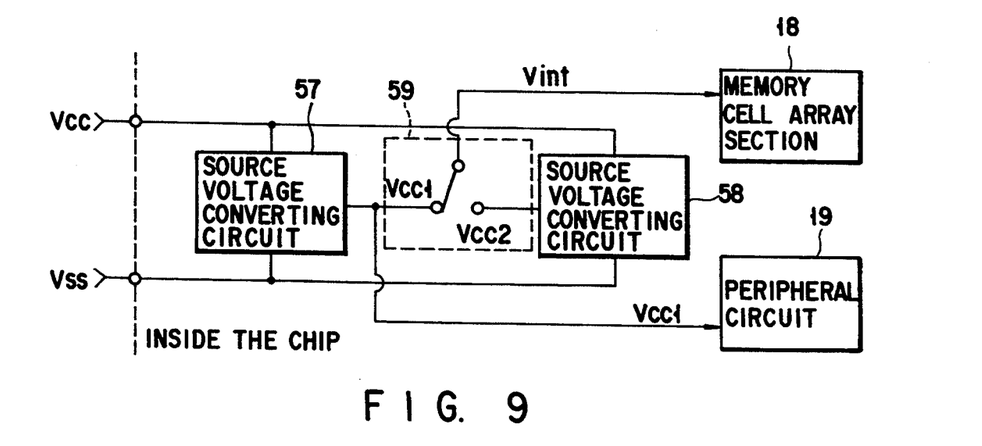
FIG. 9 is a block diagram showing the circuit configuration of a semiconductor memory chip according to another embodiment of the present invention.

FIG. 9 is a block diagram showing another embodiment of the present invention. In this embodiment, the semiconductor chip includes two source voltage converting circuits 57 and 58. A switch circuit 59 switches source voltages as follows: an internal source voltage $V_{cc1}$ lower than the external source voltage $V_{cc}$ is supplied as the internal source potential $V_{int}$ to the memory cell array section 18 and the peripheral circuit 19 in the normal operating state; and an internal source voltage $V_{cc2}$ lower than the voltage $V_{cc1}$ is supplied as the internal source potential $V_{int}$ to the memory cell array section 18 in the data maintaining state.

The source voltage converting circuits 57 and 58 have the same configuration as the circuit shown in FIG. 5, although the potentials $V_{cm1}$ and $V_{r1}$ in the circuit 57 and the potentials $V_{cm2}$ and $V_{r2}$ in the circuit 58 are set such that the voltage $V_{cc1}$ is higher than the voltage $V_{cc2}$.

Figure 10:
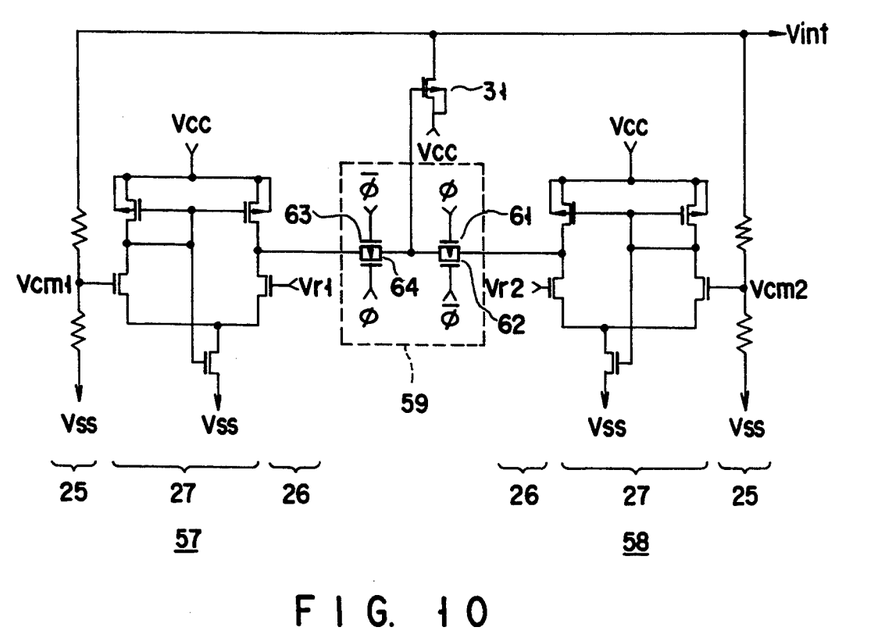
FIG. 10 is a circuit diagram showing a main part of the configuration shown in FIG. 9.

The switch circuit 59 in FIG. 9 can be of the same configuration as that of the circuit diagram of FIG. 6. Alternatively, the switch circuit 59 can be connected between the source voltage converting circuits 57 and 58 as shown in FIG. 10. The switch circuit 59 is constituted by a P-channel MOSFET 61 and an N-channel MOSFET 62 the source and drain of which are connected in parallel and a P-channel MOSFET 63 and an N-channel MOSFET 64 the source and drain of which are connected in parallel. Complementary control signals $\phi$ and $\bar{\phi}$ are supplied to the gates of the MOSFETs.

More specifically, the control signal $\bar{\phi}$ is supplied to the gates of the P-channel MOSFET 61 and the N-channel MOSFET 64 and the control signal $\phi$ is supplied to the gates of the N-channel MOSFET 62 and the P-channel MOSFET 63. The potential determined by comparing the potentials $V_{cm1}$ and $V_{r1}$ or the potentials $V_{cm2}$ and $V_{r2}$ is transferred in accordance with the control signals $\phi$ and $\bar{\phi}$ to the P-channel MOSFET 31 in the same manner as shown in the circuit diagram of FIG. 8. Thus, a desired internal source voltage $V_{int}$ can be obtained from the source voltage $V_{cc}$.

Figure 11:
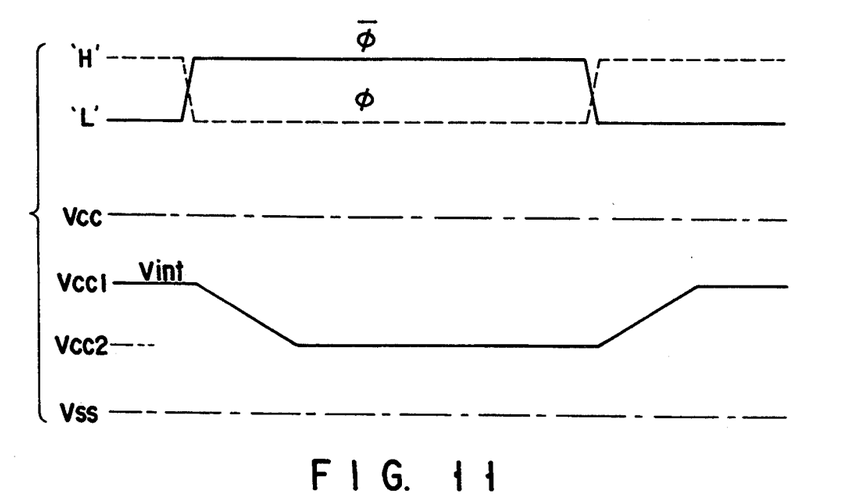
FIG. 11 is a timing chart illustrating an operation of the circuit shown in FIG. 10.

FIG. 11 is a timing chart illustrating an operation of the configuration shown in the circuit diagram of FIG. 10. When the control signal $\bar{\phi}$ is of L level, $V_{int}$ is equal to $V_{cc1}$. In this state, a normal reading and writing operation can be performed. When the control signal $\bar{\phi}$ is of H level, $V_{int}$ is equal to $V_{cc2}$. In this state, data can only be maintained. The control signals $\phi$ and $\bar{\phi}$ are generated in the same manner as in the above-described embodiment.

Figure 12:
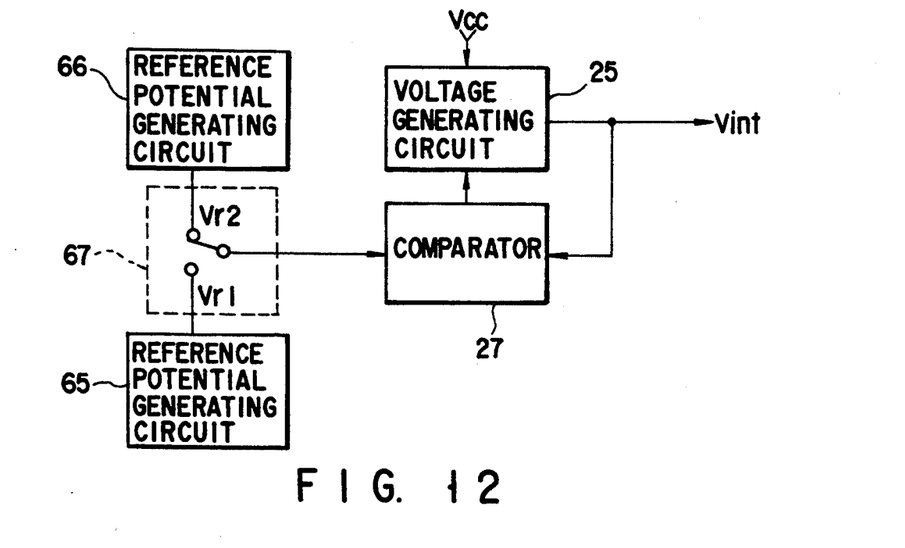
FIG. 12 is a block diagram showing a modification of the circuit configuration shown in FIG. 9.

FIG. 12 is a block diagram showing a modification of the configuration shown in the block diagram of FIG. 9. In this embodiment, only one source voltage converting circuit is provided, although the configuration shown in FIG. 9 has two source voltage converting circuit 57 and 58 to obtain source voltages $V_{cc1}$ and $V_{cc2}$. In other words, two reference potential generating circuits 65 and 66 are switched by a switch circuit 67, thereby performing the same operation as in the configuration shown in the circuit diagram of FIG. 9.

Figure 13:
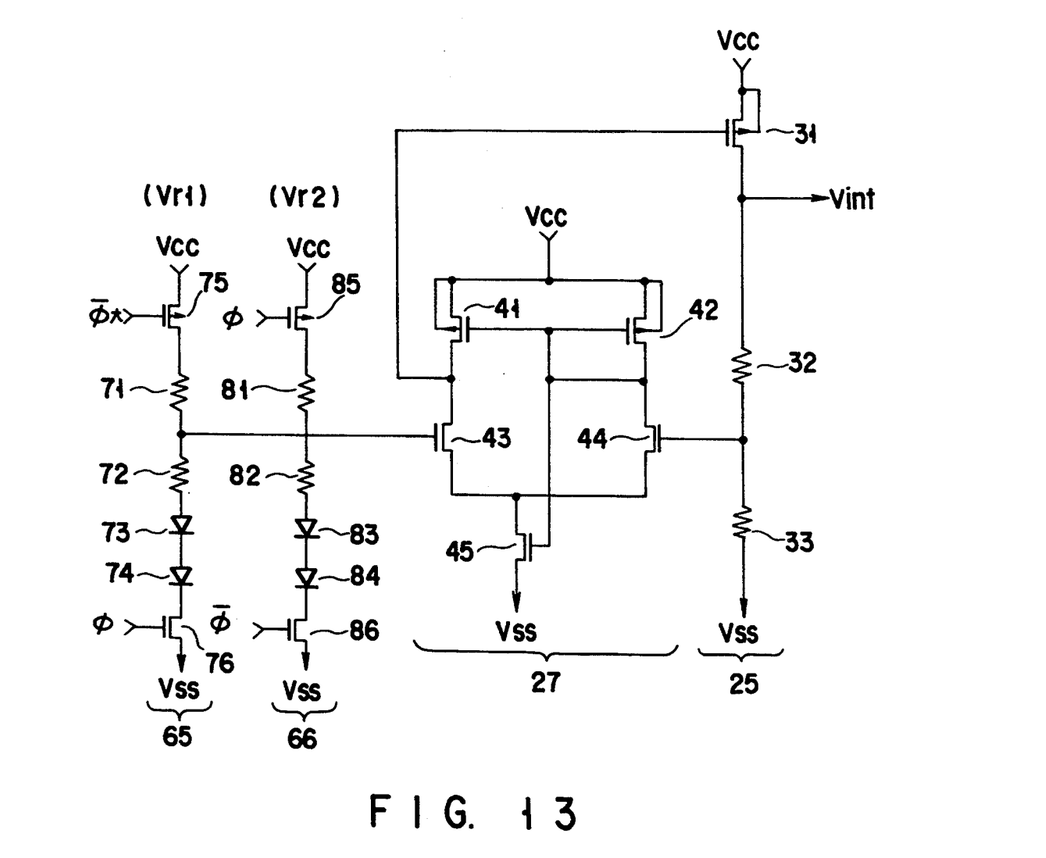
FIG. 13 is a circuit diagram showing the configuration shown in FIG. 12.

FIG. 13 is a circuit diagram showing a detailed configuration shown in the block diagram of FIG. 12. The circuit of FIG. 13 has reference potential generating circuits 65 and 66 in place of the reference potential generating circuit 26 of FIG. 5. The reference voltage generating circuit 65 produces a reference potential $V_{r1}$ based on the ratio of voltages divided by resistors 71 and 72 and diodes 73 and 74. The reference potential $V_{r1}$ is transferred and controlled by transferring P-channel and N-channel MOSFETs 75 and 76 respectively connected to the power sources $V_{cc}$ and $V_{ss}$. That is, control signals $\phi$ and $\bar{\phi}$ are respectively supplied to the MOSFETs 75 and 76.

The reference voltage generating circuit 66 produces a reference potential $V_{r2}$ based on the ratio of voltages divided by resistors 81 and 82 and diodes 83 and 84. The reference potential $V_{r2}$ is transferred and controlled by transferring P-channel and N-channel MOSFETs 85 and 86 respectively connected to power sources $V_{cc}$ and $V_{ss}$. That is, control signals $\bar{\phi}$ and $\phi$ are respectively supplied to the MOSFETs 85 and 86.

As described above, the level of the potential generated by the source voltage converting circuit can be changed by switching the reference potential input to the comparator 27 by use of the switch circuit 67. Assuming that the source voltage converting circuit generates a potential of $V_{cc1}$ when the reference potential $V_{r1}$ is input to the comparator and a potential of $V_{cc2}$ when the reference potential $V_{r2}$ is input to the comparator, the potential $V_{cc1}$ is greater than the potential $V_{cc2}$, where $V_{r1}$ is greater than $V_{r2}$.

The operations of the control signals $\bar{\phi}$ and $\phi$ and the source voltage supplied to the memory cell array section as shown in FIG. 13 are the same as shown in the timing chart of FIG. 11. Therefore, detailed explanations thereof are not repeated here.

The above embodiments mainly relate to a DRAM. However, in a SRAM or PSRAM also, low power consumption can be achieved while retaining a high-speed access capability, when the memory device is switched from the data maintaining state to the normal operating state.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
    source voltage supplying means for receiving an external source voltage and supplying a first source voltage corresponding to the external source voltage and a second source voltage lower than the first source voltage to an internal circuit, said source voltage supplying means including,
    converting means for converting the external source voltage to the second source voltage, and
    source voltage selecting means for selecting one of the second source voltage obtained by the converting means and the first source voltage corresponding to the external source voltage;
    a memory cell array section, including at least a sense amplifier, to which the first source voltage is supplied during a first operation in which data is transferred between said memory cell array section and an external device, and to which the second source voltage is supplied during a second operation in which data is refreshed and maintained in said memory cell array section, wherein said source voltage selecting means selects in accordance with the first or the second operation of the memory cell array section; and
    a peripheral circuit to which the first source voltage is supplied during the second operation in which the second source voltage is supplied to said memory cell array section to refresh and maintain data.

2. A semiconductor memory device according to claim 1, wherein said source voltage selecting means includes switching means for switching the first source voltage and the second source voltage upon receipt of a command signal supplied from an external circuit.

3. A semiconductor memory device according to claim 1, wherein said converting means comprises:
    first source voltage converting means for receiving and converting the external source voltage to a first internal source voltage which is lower than the external source voltage; and second source voltage converting means for receiving and converting the external source voltage to a second internal source voltage which is lower than the first internal source voltage obtained by said first source voltage converting means.

4. A semiconductor memory device according to claim 1, wherein said converting means comprises:

source voltage lowering means for receiving and lowering the external source voltage and supplying the lowered voltage to the internal circuit;

reference potential generating means for generating first and second reference potentials; and reference potential supplying means for supplying the first reference potential to the source voltage lowering means when the first source voltage is to be used as an operation voltage, and the second reference potential to the source voltage lowering means when the second source voltages is to be used as an operation voltage.

5. A semiconductor memory device according to claim 1, wherein said peripheral circuit includes at least an address buffer and a data input/output buffer.

6. A semiconductor memory device according to claim 1, wherein said peripheral circuit includes an address buffer, a data input/output buffer, a row decoder, and a column decoder.

7. A semiconductor memory device comprising:

a memory cell array section including a plurality of memory cells and which is powered in accordance with potentials derived from a memory cell array section voltage;

peripheral circuitry including circuitry for decoding address data to select said memory cells and which is powered in accordance with potentials derived from a peripheral circuitry voltage;

means for supplying a first voltage to said peripheral circuitry as said peripheral circuitry voltage when said semiconductor memory device is in a first operating state in which said memory cell array section is accessed for data reading and writing, and for supplying said first voltage to said peripheral circuitry as said peripheral circuitry voltage when said semiconductor memory device is in a second operating state in which said memory cell array section is not accessed for data reading and writing; and a switch responsive to a first control signal for supplying said first voltage to said memory cell array section as said memory cell array section voltage when said semiconductor memory device is in said first operating state, and for supplying a second voltage lower than said first voltage to said memory cell array section as said memory cell array section voltage when said semiconductor memory device is in said second operating state.

8. The semiconductor memory device according to claim 7, wherein said memory cell array section further includes:

pairs of bit lines to which said plurality of memory cells are connected, a plurality of word lines for selecting said memory cells, and sense amplifiers coupled to said pairs of bit lines.

9. The semiconductor memory device according to claim 8, further comprising:

a first transfer transistor having a first terminal connected to said switch, a second terminal connected to a node common to first ones of said sense amplifiers, and a gate supplied with a second control signal.

10. The semiconductor memory device according to claim 9, further comprising:

a second transfer transistor having a first terminal connected to a $V_{ss}$ potential, a second terminal connected to a node common to second ones of said sense amplifiers, and a gate supplied with a third control signal.

11. The semiconductor memory device according to claim 10, wherein said second transfer transistor is of a conductivity type opposite to a conductivity type of said first transfer transistor and said third control signal is complementary to said second control signal.

12. The semiconductor memory device according to claim 8, wherein said peripheral circuitry comprises:

a column decoder for selecting said pairs of bit lines; and a row decoder for selecting said word lines.

13. The semiconductor memory device according to claim 7, further comprising:

a voltage converting circuit for converting said first voltage to said second voltage and supplying said second voltage to said switch.

14. The semiconductor memory device according to claim 7, said memory cells each comprise a transfer transistor and a data storage capacitor.

15. The semiconductor memory device according to claim 14, wherein said memory cell array section further comprises:

precharging circuitry for precharging said pairs of bit lines; and means for supplying a plate potential to said data storage capacitors.

16. The semiconductor memory device according to claim 7, wherein said second voltage is approximately one-half of said first voltage.

17. A semiconductor memory device comprising:

a source voltage converting circuit for receiving an external voltage corresponding to a first source voltage and converting the external source voltage to a second source voltage lower than the first source voltage;

a selection circuit which receives the first source voltage and the second source voltage for selecting one of the first source voltage and the second source voltage;

a memory cell array section having a sense amplifier, said selection circuit supplying the first source voltage to said sense amplifier during a data transfer operation in which data is transferred between said memory cell array section and an external device, and said selection circuit supplying the second source voltage to said sense amplifier during a data refresh operation in which data in the memory cell array section is refreshed; and a peripheral circuit which receives the first source voltage during the data refresh operation.

* * * * *